(12) United States Patent
Brunsvold et al.

(10) Patent No.: US 6,372,406 B1
(45) Date of Patent: Apr. 16, 2002

(54) DEACTIVATED AROMATIC AMINES AS ADDITIVES IN ACID-CATALYZED RESISTS

(75) Inventors: William R. Brunsvold; Ahmad D. Katnani; Pushkara R. Varanasi, all of Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/706,682

(22) Filed: Nov. 6, 2000

Related U.S. Application Data

(63) Continuation of application No. 09/146,868, filed on Sep. 3, 1998.

(51) Int. Cl.[7] ................................................. G03C 1/73
(52) U.S. Cl. ................................ 430/270.1; 430/281.1; 430/326; 430/914; 430/919; 430/920; 430/921; 430/923
(58) Field of Search .............................. 430/270.1, 914, 430/326, 919, 920, 921, 923, 281.1

(56) References Cited

U.S. PATENT DOCUMENTS

| | | | |
|---|---|---|---|
| 4,491,628 A | 1/1985 | Ito et al. ..................... | 430/176 |
| 4,543,319 A | 9/1985 | Chao et al. .................. | 430/312 |
| 4,980,317 A | 12/1990 | Koblinger et al. ........... | 437/228 |
| 5,071,730 A | 12/1991 | Allen et al. .................. | 430/270 |
| 5,320,931 A | 6/1994 | Umehara et al. ............ | 430/270 |
| 5,492,793 A | 2/1996 | Breyta et al. ........... | 430/270.14 |
| 5,547,808 A | 8/1996 | Watanabe .................... | 430/176 |
| 5,712,078 A | 1/1998 | Huang et al. ............. | 430/270.1 |
| 5,776,660 A | 7/1998 | Hakey et al. ................ | 430/296 |

FOREIGN PATENT DOCUMENTS

| | | | | |
|---|---|---|---|---|
| EP | 0 523 957 A1 | 1/1993 | ........... | G03F/7/075 |
| EP | 0 537 524 A1 | 4/1993 | ........... | G03F/7/004 |
| EP | 1 014 193 A1 * | 6/2000 | | |

OTHER PUBLICATIONS

Morrison, et al. "Electrophilic Aromatic Substitution. Reactivity and Orientation", Organic Chemistry, Boston 1959, Chapter 10, pp. 284–288 and Chapter 20, pp. 547–548.

* cited by examiner

*Primary Examiner*—Janet Baxter
*Assistant Examiner*—Sin J. Lee
(74) *Attorney, Agent, or Firm*—Steven Capella

(57) ABSTRACT

Deactivated aromatic amines are useful to improve shelf life and performance of acid-catalyzed photoresist compositions without adverse interaction with radiation-sensitive acid generator components in said resist. The compositions are especially useful in photolithography processes used in forming integrated circuits and other miniaturized components.

6 Claims, No Drawings

DEACTIVATED AROMATIC AMINES AS ADDITIVES IN ACID-CATALYZED RESISTS

This application is a continuation of Ser. No. 09/146,868 filed Sep. 3,1998.

BACKGROUND OF THE INVENTION

Acid-catalyzed resist compositions are widely used in photolithography applications for manufacture of integrated circuits and other devices where patterned mask layers are employed in device manufacture.

Acid-catalyzed photoresists are generally characterized by the combination of an acid-sensitive resist polymer (or in some instances an acid-sensitive monomer or oligomer) with a radiation-sensitive acid-generating compound (photosensitive acid generator or PAG). On exposure of the resist composition to a suitable radiation source, the PAC generates an acid of sufficient strength to cause a reaction with the acid-sensitive resist polymer or other acid-sensitive component. The reaction is typically catalytic in nature (i.e., the initial acid generated reacts with the acid-sensitive polymer to create additional acid which is available for further reaction). The acid-catalyzed reaction is often enhanced by baking the exposed resist composition.

In the case of positive photoresist compositions, the acid generated on exposure to radiation typically causes the exposed resist composition to exhibit increased solubility in alkaline media (and/or other property difference) compared to the unexposed resist. In negative resists, the acid generated typically causes the exposed resist composition to exhibit reduced solubility in alkaline media;(and/or other property difference) compared to the unexposed resist. Some acid-catalyzed resist compositions (hybrid resists) are capable of acting as positive or negative resists depending on the radiation exposure and post-exposure treatment.

In most applications, the acid-catalyzed resist composition is applied to a surface where a patterned (mask) layer is desired (e.g. to the surface of a semiconductor wafer) as a liquid solution. The solvent is then typically removed to form a thin solid layer on the desired surface. In many instances, the solvent removal may be assisted by a heating step. The applied resist layer is then exposed to the desired radiation. The exposure is typically done through a mask containing a pattern of openings to create a corresponding pattern of exposed areas in the resist. In some cases, such as with the use of electron beam (e-beam) radiation, a pattern-wise exposure may be achieved without a mask by scanning the electron-beam over the resist layer in a patterned manner.

After exposure, the pattern is developed by selective removal of the exposed or unexposed portions of the resist depending on whether the resist acting in a positive mode or a negative mode. Prior to selective removal, the exposed resist layer may be treated by application of heat to enhance the property differences created by the exposure. Once the exposed resist layer is ready for development, the selective removal is typically done by treating the resist layer with a solvent which selectively removes portions of the resist by dissolution. The patterned resist layer may then be used in whatever manner desired for the specific manufacturing objective.

In most photolithography applications, the size of detail in the exposed pattern continues to become increasingly finer. Often, there is a desire to create patterns having resolution of details in the sub-micron range. This desire is especially strong in the manufacture of integrated circuits since the reduction of detail size generally corresponds to an increase is device density that can be constructed. Similar desires for the ability to produce fine details exist in other areas such as the manufacture of micromachines, magnetic heads, magnetic/electronic storage devices, etc.

In addition to the performance pressures created by the demand for finer resolution, there are the significant demands associated with large scale commercial manufacture. For example, the photoresist composition should retain its performance capability even after storage between formulation and use. In addition, the retained performance should be predictable. Photoresist compositions having a better ability to meet these manufacturing demands will result in reduced cost of the overall manufacturing process (e.g. more consistent reproduction of patterns, greater flexibility in manufacturing process configuration, etc.).

For acid-catalyzed positive photoresists, the presence of residual acidic species in the unexposed photoresist composition often causes performance degradation due to gradual reaction of the residual acid with the acid-sensitive polymer. Since this reaction is not controlled by the radiation exposure, performance degradation such as loss of contrast, variation in dose sensitivity, etc. can result. Additionally, residual acid may cause loss of shelf life in the photoresist formulation. In some instances, shelf life up to a year may demanded of a photoresist formulation.

In the past, the problem of residual acid in positive photoresists has been addressed by addition of certain base additives to the photoresist composition to scavenge residual acid. Unfortunately, such base additives have often exhibited adverse interaction with the photosensitive acid generator in the photoresist composition.

SUMMARY OF THE INVENTION

The invention provides acid-catalyzed positive photoresist compositions which have improved shelf-life and performance consistency. The compositions of the invention are generally characterized by the presence of a deactivated aromatic amine additive.

In one aspect, the invention encompasses positive photoresist compositions comprising:
  a) an acid-sensitive positive photoresist polymer component selected from the group consisting of (i) an acid-sensitive photoresist polymer, (ii) an acid-sensitive photoresist polymer with an additional acid-sensitive compound, and (iii) a non-acid-sensitive alkaline-soluble photoresist polymer with an acid-sensitive alkaline solubility inhibitor,
  b) a radiation-sensitive acid-generating component, and
  c) a deactivated aromatic amine.

The photoresist polymer preferably contains acid-labile groups which generate acid upon cleaving. The compositions may contain a solvent for the unexposed resist.

The invention also encompasses photoresist structures containing the photoresist compositions of the invention as well as photolithographic processes using the photoresist compositions of the invention to make photoresist structures and to transfer patterns from photoresist structures to an underlying layer of ceramic insulator, metal conductor, semiconductor or other material.

These and other aspects of the invention are discussed in further detail below.

DETAILED DESCRIPTION OF THE INVENTION

Broadly, the invention is based on the discovery that deactivated aromatic amines are especially useful as additives to improve the shelf life and performance of chemically amplified photoresist compositions, especially in comparison to other known base additives. The invention also encompasses the discovery that deactivated aromatic amines have improved compatibility with a wider range of photosensitive acid-generating components which may be used in chemically amplified positive photoresist compositions.

The chemically amplified positive photoresist compositions of the invention are generally characterized by the combination of:

a) acid-sensitive positive photoresist polymer component selected from the group consisting of (i) an acid-sensitive photoresist polymer, (ii) an acid-sensitive photoresist polymer with an additional acid-sensitive compound, and (iii) a non-acid-sensitive alkaline-soluble photoresist polymer with an acid-sensitive alkaline solubility inhibitor, b) a radiation-sensitive acid-generating component, and c) a deactivated aromatic amine.

The photoresist polymer component preferably contains acid-labile groups which generate acid upon cleaving. The compositions may contain a solvent for the unexposed resist as well as other auxiliary components.

The photoresist polymer used in the present invention may be any acid-sensitive positive photoresist polymer. These polymers are typically characterized by the presence of acid-labile "protecting" groups and alkaline-solubility promoting polar groups on the photoresist polymer. The acid-labile "protecting" groups act to inhibit alkaline-solubility (i.e. they "protect" the polymer against solubility in alkaline media). Typically, alkaline media such as aqueous basic solutions are used to develop the patterns in patternwise-exposed photoresist compositions by dissolution of the exposed portions of the photoresist. The balance of acid-labile protecting groups and solubility-promoting polar groups is preferably such that the unexposed photoresist composition remains substantially insoluble in alkaline media (especially aqueous solutions with pH >7). On exposure to a suitable dose of radiation, acid generated by the photosensitive acid generator in the photoresist composition catalyzes cleavage of acid-labile groups from the photoresist polymer. The loss of protecting groups by cleavage shifts the balance of functional groups on the photoresist polymer such that the exposed photoresist composition becomes soluble in alkaline media (e.g. developer solutions).

The photoresist polymers are preferably further characterized in that at least a portion, if not all, of the acid-labile groups generate additional acid upon cleavage which acid promotes cleavage of additional acid-labile groups on the polymer. In such polymers, the effect of the acid generated by the photosensitive acid generator is said to be "amplified" by this chain reaction effect. The photoresist polymers useful in the invention are otherwise is not limited to any specific composition. Examples of preferred photoresist polymers are polymers based on acrylate chemistry such as described in U.S. Pat. No. 5,071,730; polymers containing hydroxystyrene or other polar-functionalized aromatics such as described in U.S. Pat. No. 4,491,628 and 5,492,793; and polymers containing acid-labile ketal groups such as described in U.S. Pat. No. 5,712,078. The disclosures of these patents are incorporated herein by reference.

The photoresist compositions of the invention are further characterized by the presence of a radiation-sensitive acid generating component (also known as a photosensitive acid generator or PAG). The invention is not limited to the use of any specific PAG or combination of PAG's, that is, the benefits of the invention may be achieved using various photosensitive acid generators known in the art. One of the advantages of the base additives used in the compositions of the invention is that they exhibit compatibility with a wide variety of PAGs.

Examples of suitable photosensitive acid generators include onium salts such as tri aryl sulfonium hexafluoroantimonate, diaryliodonium hexafluoroantimonate, hexafluoroarsenates, trifled (e.g. triphenylsulfonium triflate, bis (t-butyl phenyl) iodonium triflate), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α–α' bis-sulfonyl diazomethanes, sulfonate esters of nitro-substituted benzyl alcohols, naphthoquinone-4-diazides, alkyl disulfones and others.

A key feature of the invention is that the positive photoresist composition contain a deactivated aromatic amine compound as a base additive. The deactivated aromatic amine preferably has the following structure:

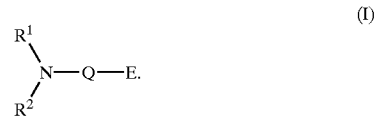

Q preferably comprises at least one cyclic aromatic structure (e.g., a $C_6$ aromatic ring or fused aromatic ring). Q may further comprise other cyclic structures selected from the group consisting of aromatic hydrocarbon rings, alicyclic rings, heterocyclic rings or combinations thereof. Preferred heterocyclic rings contain oxygen as a heteroatom.

E preferably comprises one or more electron withdrawing groups of sufficient strength to deactivate free electrons of the nitrogen bonded to Q. E is preferably selected from the group consisting of —$NO_2$, —$COOR^3$, —$COR^4$, —$CF_3$, —$CCl_3$, and —CN.

$R^1$ and $R^2$ are independently selected from the group consisting of alkyl, cycloalkyl and aryl groups, except that where one of $R^1$ and $R^2$ is an aryl group, the other of $R^1$ and $R^2$ may be hydrogen. $R^3$ and $R^4$ are independently selected from the group consisting of aryl and alkyl groups.

Alternatively and more preferably, the deactivated aromatic amine compound may be a compound such as 7-diethylamino-4-methylcoumarin as shown in examples 3 and 5 in the present application.

The deactivated aromatic amine additive preferably has a bake out temperature in the resist formulation of at least about 140–150° C.

The photoresist compositions of the invention will typically contain a solvent prior to their application to the desired substrate. The solvent may be any solvent conventionally used with acid-catalyzed photoresists which otherwise does not have any excessively adverse impact on the performance of the photoresist composition. Preferred solvents are propylene glycol monomethyl ether acetate, ethyl lactate, cyclohexanone, and 3-ethoxyethyl propionate.

The photoresist compositions of the invention may further contain minor amounts of auxiliary components such as dyes, sensitizers, etc. as are known in the art.

The photoresist compositions of the invention are not limited to any specific positive photoresist formulation. In general, the photoresist compositions of the invention preferably contain about 0.5–20 wt. % (more preferably about 1–10 wt. %) photosensitive acid generator based on the total weight of acid sensitive photoresist polymer in the composition. Where a solvent is present, the overall composition preferably contains about 50–95 wt. % solvent. The photoresist compositions of the invention preferably contain at least about 0.05 wt. % (more preferably about 0.1–1.0 wt. %) of the deactivated aromatic amine base additive based on the total weight of acid sensitive photoresist polymer.

The photoresist compositions of the invention can be prepared by combining the acid sensitive photoresist polymer, PAG, deactivated aromatic amine base additive, and any other desired ingredients using conventional methods. The photoresist composition to be used in photolithographic processes will generally have a significant amount of solvent.

The photoresist compositions of the invention are especially useful for photolithographic processes used in the manufacture of integrated circuits on semiconductor substrates. The compositions are especially useful for photolithographic processes using deep UV radiation (e.g. 190–315 nm wavelength), especially 248 nm wavelength radiation. Where use of other radiation (e.g. mid-U V or e-beam) is desired, the compositions of the invention can be adjusted by use of a PAG having sensitivity to the desired radiation or by addition of an appropriate dye or sensitizer to the composition. The general use of the photoresist compositions of the invention in photolithography for semiconductors is described below.

Semiconductor photolithographic applications generally involve transfer of a pattern to a layer-of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the photoresist layer. The ARC layer may be any conventional ARC which is compatible with acid catalyzed photoresists.

Typically, the solvent-containing photoresist composition is applied to the desired semiconductor substrate using spin coating or other technique. The substrate with the photoresist coating is then preferably heated (pre-exposure baked) to remove the solvent and improve the coherence of the photoresist layer. The thickness of the applied layer is preferably as thin as possible with the provisos that the thickness is preferably substantially uniform and that the photoresist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 30 seconds to one minute. The pre-exposure bake temperature may vary depending on the glass transition temperature of the photoresist. Preferably, the pre-exposure bake is performed at temperatures of $T_g \pm$ about 5° C.

After solvent removal, the photoresist layer is then patternwise-exposed to the desired radiation (e.g. deep-UV or e-beam). Where scanning particle beams such as electron beam are used, patternwise exposure may be achieved by scanning the beam across the substrate and selectively applying the beam in the desired pattern. More typically, where wavelike radiation forms such as 248 nm ultraviolet radiation, the patternwise exposure is conducted through a mask which is placed over the photoresist layer. For deep UV radiation, the total exposure energy is preferably about 100 millijoules/cm$^2$ or less, more preferably about 50 millijoules/cm$^2$ or less.

After the desired patternwise exposure, the photoresist layer is typically baked to further complete the acid-catalyzed reaction and to enhance the contrast of the exposed pattern. The post-exposure bake is preferably conducted at about 90–175° C., more preferably about 110–140° C. The post-exposure bake is preferably conducted for about 60 seconds to 90 seconds. With some acid-catalyzed photoresists polymers (e.g. containing acid-labile ketal groups), it may be possible to obtain adequate development without post-exposure baking.

After post-exposure bake, the photoresist structure with the desired pattern is obtained (developed) by contacting the photoresist layer with an alkaline solution which selectively dissolves the areas of the photoresist which were exposed to radiation. Preferred alkaline solutions (developers) are aqueous solutions of tetramethyl ammonium hydroxide. The resulting photoresist structure on the substrate is then typically dried to remove any remaining solvent. The photoresist compositions of the invention are generally characterized in that the product photoresist structures having high etch resistance. In some instances, it may be possible to further enhance the etch resistance of the photoresist structure by using a post-silylation technique using methods known in the art.

The pattern from the photoresist structure may then be transferred to the material of the underlying substrate. Typically, the transfer is achieved by reactive ion etching or some other etching technique. The substrate material receiving the transferred pattern may be a semiconductor, metal or insulator. The photoresist structures of the invention may be used for example in formation of contact holes, damascene or dual damascene trenches, capacitor trenches, metal wiring layers, etc. Examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithography technique or device structure.

The invention is further illustrated by the following examples. It should be understood that the invention is not limited to the details of the examples.

EXAMPLE 1 (COMPARATIVE EXAMPLE)

This example demonstrates the shelf-life deterioration of a typical chemically amplified positive resist formulation containing a commonly employed ionic base additive, tetralkylammonium hydroxide. The photoresist formulation was prepared by combining the materials set forth below, expressed in parts by weight:

| | |
|---|---|
| Propylene glycol monomethyl ether acetate | 84 |
| Hydroxystyrene-t-butylacrylate copolymer (65:35) | 15.33 |
| Di-t-butylphenyliodonium camphorsulfonate | 0.64 |
| Tetramethylammonium hydroxide | 0.032 |

The photoresist formulation was divided into two parts: one part was stored at 0° C. and the other part was kept at 40° C. (in an oven) for 15 days. Both these solutions were spin coated onto silicon wafers for 30 seconds, then soft baked at 140° C. for 60 seconds on a vacuum hot plate each yielding a film of 0.8 micron thickness. The wafers were exposed over a range of exposure energies using a Canon 0.37NA excimer laser stepper. The wafers were then post-exposure baked on a vacuum hot plate at 140° C. for 90 seconds. Exposed wafers were then developed using 0.263N TMAH developer for 60 seconds. The thickness remaining at every exposure dose was measured. From these measurements, photospeed ($E_0$) of the resist (dose at which the complete thickness of the positive resist was fully developed) was determined. The $E_0$ data are set forth below.

| | $E_0$ |
|---|---|
| The photoresist stored at 0° C. for 15 days: | 6.6 mJ/cm$^2$ |
| The photoresist stored at 40° C. for 15 days: | 5.2 mJ/cm$^2$ (Change: 21%) |

EXAMPLE 2 (COMPARATIVE EXAMPLE)

This example demonstrates the shelf-life deterioration of a typical chemically amplified positive resist formulation containing a conventional aromatic amine, 1,8-bis (dimethylamino) napthalene. The photoresist formulation was prepared by combining the materials set forth below, expressed in parts by weight:

| | |
|---|---|
| Propylene glycol monomethyl ether acetate | 84 |
| Hydroxystyrene-t-butylacrylate copolymer (65:35) | 15.33 |
| Di-t-butylphenyliodonium camphorsulfonate | 0.64 |
| 1,8-Bis(dimethylamino)napthalene | 0.032 |

The shelf-life determination experiments were carried out under the same conditions as described in the Example 1 and the data is summarized below.

| | $E_0$ |
|---|---|
| The photoresist stored at 0° C. for 15 days: | 4.8 mJ/cm$^2$ |
| The photoresist stored at 40° C. for 15 days: | 4.2 mJ/cm$^2$ (Change: 12.5%) |

EXAMPLE 3

This example demonstrates the ability to eliminate the shelf-life deterioration of chemically amplified positive resists using deactivated aromatic amine base additives of this invention. The photoresist formulation was prepared by combining the materials set forth below, expressed in parts by weight:

| | |
|---|---|
| Propylene glycol monomethyl ether acetate | 84 |
| Hydroxystyrene-t-butylacrylate copolymer (65:35) | 15.33 |
| Di-t-butylphenyliodonium camphorsulfonate | 0.64 |
| 7-Diethylamino-4-methylcoumarin | 0.032 |

The shelf-life determination experiments were carried out under the same conditions as described in the Example 1 and the data is summarized below.

| | $E_0$ |
|---|---|
| The photoresist stored at 0° C. for 15 days: | 9.0 mJ/cm$^2$ |
| The photoresist stored at 40° C. for 15 days: | 9.0 mJ/cm$^2$ (Change: 0%) |

EXAMPLE 4 (COMPARATIVE EXAMPLE)

This example illustrates the resolution capabilities of a fresh chemically amplified photoresist formulation that does not contain any base additive. The photoresist formulation was prepared by combining the materials set forth below, expressed in parts by weight:

| | |
|---|---|
| Propylene glycol monomethyl ether acetate | 82 |
| Hydroxystyrene-t-butylacrylate-styrene terpolymer (65:15:20) | 17.1 |
| Di-t-butylphenyliodonium camphorsulfonate | 0.9 |

The photoresist formulation was spin coated onto silicon wafers for 30 seconds, then soft baked at 130° C. for 60 seconds on a vacuum hot plate yielding a film of 0.68 micron thickness. An array of line space pairs with varying dimensions down to 0.15 $\mu$m was exposed over a range of exposure energies using a GCA 0.53NA excimer laser stepper. The wafers were then post-exposure baked on a vacuum hot plate at 130° C. for 90 seconds. The exposed wafers were then developed for using 0.263N TMAH developer for 60 seconds. The patterned wafers were diced and examined by scanning electron microscopy (SEM) to determine the minimum size line-space pair that was resolved and photoresist profile characteristics. SEM analysis showed that 0.25 $\mu$m line-space pairs were well resolved with clean profiles.

EXAMPLE 5

This example illustrates the role of the deactivated aromatic amines of the invention in improving the resolution capabilities of a typical chemically amplified positive resist. The photoresist formulation was prepared by combining the materials set forth below, expressed in parts by weight:

| | |
|---|---|
| Propylene glycol monomethyl ether acetate | 82 |
| Hydroxystyrene-t-butylacrylate-styrene terpolymer (65:15:20) | 17.1 |
| Di-t-butylphenyliodonium camphorsulfonate | 0.9 |
| 7-diethylamino-4-methyl coumarin | 0.072 |

The photoresist formulations were exposed and processed as described in Example 4. SEM analysis showed that 0.20 $\mu$m line space pairs were well resolved with clean profiles. Comparison of this data with the Example 4 indicates the role of deactivated aromatic amine in improving the resolution capabilities of positive resists.

What is claimed is:

1. A non-hybrid positive photoresist composition comprising (a) an acid-sensitive positive non-hybrid photoresist polymer component selected from the group consisting of (i) an acid-sensitive photoresist polymer, (ii) an acid-sensitive photoresist polymer with an additional acid-sensitive compound, and (iii) a non-acid-sensitive alkaline-soluble photoresist polymer with an acid-sensitive alkaline solubility inhibitor, (b) a radiation-sensitive acid-generating component, said acid-generating component being capable of generating an acid on exposure to radiation or particle beam energy, and (c) 7-diethylamino-4-methylcoumarin.

2. The composition of claim 1 wherein said positive non-hybrid photoresist polymer component is (i) an acid-sensitive photoresist polymer which comprises an acid labile component which generates acid on cleaving from said polymer.

3. The composition of claim 1 wherein said radiation-sensitive component is selected from the group consisting of onium salts, substituted aryl sulfonates, sulfonate esters of hydroxyimides, N-sulfonyloxynaphthalimides, $\alpha$–$\alpha'$ bis-sulfonyl diazomethanes, sulfonate esters of nitro-substituted benzyl alcohols, naphthoquinone-4-diazides, alkyl disulfones, and mixtures thereof.

4. The composition of claim 1 wherein said composition further comprises a solvent for said polymer component.

5. The composition of claim 1 wherein said composition contains about 0.05–1.0 wt. % of said 7-diethylamino-4-methylcoumarin based on the total solids in said composition.

6. The composition of claim 1 wherein said composition contains about 0.5–20 wt. % of said radiation-sensitive acid-generating component based on the total solids in said composition.

* * * * *